US010663846B2

(12) United States Patent
Hirasawa

(10) Patent No.: US 10,663,846 B2
(45) Date of Patent: May 26, 2020

(54) IMAGE PROJECTION UNIT AND FILTER BOX

(71) Applicant: SONY CORPORATION, Tokyo (JP)

(72) Inventor: Takeaki Hirasawa, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/329,262

(22) PCT Filed: Aug. 21, 2017

(86) PCT No.: PCT/JP2017/029812
§ 371 (c)(1),
(2) Date: Feb. 28, 2019

(87) PCT Pub. No.: WO2018/079024
PCT Pub. Date: May 3, 2018

(65) Prior Publication Data
US 2019/0250488 A1 Aug. 15, 2019

(30) Foreign Application Priority Data
Oct. 31, 2016 (JP) .................................. 2016-213087

(51) Int. Cl.
G03B 21/16 (2006.01)
H04N 9/31 (2006.01)
G03B 21/14 (2006.01)
H05K 7/20 (2006.01)
(Continued)

(52) U.S. Cl.
CPC ............. G03B 21/16 (2013.01); G03B 21/00 (2013.01); G03B 21/14 (2013.01); G03B 21/145 (2013.01); H04N 5/74 (2013.01); H04N 9/3144 (2013.01); H05K 7/20 (2013.01)

(58) Field of Classification Search
CPC .... G03B 21/16; G03B 21/145; H04N 9/3144; H04N 9/3141
See application file for complete search history.

(56) References Cited

U.S. PATENT DOCUMENTS

2011/0176117 A1 7/2011 Kondo
2013/0180222 A1* 7/2013 Okada ................ B01D 46/0023 55/482
2013/0298773 A1 11/2013 Yamagishi et al.

FOREIGN PATENT DOCUMENTS

JP 8-194201 A 7/1996
JP 2003-162005 A 6/2003
JP 2009-115967 A 5/2009
(Continued)

OTHER PUBLICATIONS

International Search Report dated Nov. 7, 2017 in PCT/JP2017/029812 filed on Aug. 21, 2017.

Primary Examiner — Ryan D Howard
(74) Attorney, Agent, or Firm — Oblon, McClelland, Maier & Neustadt, L.L.P.

(57) ABSTRACT

To provide an image projection unit that can reduce the frequency of filter replacement and extend the life of an image projection device main body.
Provided is an image projection unit including: a main body (10) of an image projection device; and a filter box (100A) that can be attached/detached to/from the main body (10), and at least covers an air inlet of the main body. A box-side filter provided for the filter box (100A) has a total area larger than an area of a main body filter provided at the air inlet of the main body (10).

11 Claims, 11 Drawing Sheets

(51) Int. Cl.
*H04N 5/74* (2006.01)
*G03B 21/00* (2006.01)

(56) References Cited

FOREIGN PATENT DOCUMENTS

| | | |
|---|---|---|
| JP | 2010-78976 A | 4/2010 |
| JP | 2011-150014 A | 8/2011 |
| JP | 2015-36789 A | 2/2015 |
| JP | 2015-222305 A | 12/2015 |
| JP | 2017-159266 A | 9/2017 |
| WO | WO 2012/077211 A1 | 6/2012 |
| WO | WO 2012/105208 A1 | 8/2012 |

* cited by examiner

IMAGE PROJECTION UNIT AND FILTER BOX

TECHNICAL FIELD

The present disclosure relates to an image projection unit and a filter box.

BACKGROUND ART

In a projector which is an image projection device that projects and displays an image on a screen or the like, a failure of equipment and degradation of optical components are more likely to occur in accordance with the usage time and usage environment. For example, in order to prevent dust intrusion into the projector, the projector is provided with a filter at an air inlet. However, as the usage time of the projector increases, dust adhering to the filter increases. Accordingly, the pressure loss increases, and taking-in of cooling air into the projector is inhibited. In the case where such a state progresses further, the inside of the projector can no longer be cooled sufficiently, and damages to various devices arranged within the projector, in particular, optical devices, are likely to occur to shorten the life. The filter life is generally shorter than the life of the projector main body, and periodic filter replacement is necessary.

For such a situation, an external filter that covers the projector main body, for example, has been proposed (for example, Patent Literature 1 and Patent Literature 2). In addition, in order not to reduce cooling performance of the projector, a technology for providing a cooling device having a cooling fan and a Peltier element within the projector, and achieving both noise reduction and effective cooling has been proposed (for example, Patent Literature 3).

CITATION LIST

Patent Literature

Patent Literature 1: JP 2003-162005A
Patent Literature 2: JP 2015-36789A
Patent Literature 3: JP H8-194201A

DISCLOSURE OF INVENTION

Technical Problem

However, even if a filter is provided externally as described in Patent Literature 1 and Patent Literature 2 above, the filter life cannot be extended, and the external filter needs to be replaced even if the main body filter does not need to be replaced. In addition, when a cooling device is incorporated into the projector as described in Patent Literature 3 above, the projector main body is increased in size. Further, with the technology in Patent Literature 3 above, a structure unnecessary for a user who does not place importance on noise reduction is built in the projector main body, so that not only the projector main body is increased in size, but also a cost should be incurred for unnecessary functions.

Therefore, the present disclosure proposes an image projection unit and a filter box that are novel and improved, and can reduce the frequency of filter replacement and extend the life of an image projection device main body.

Solution to Problem

According to the present disclosure, there is provided an image projection unit including: a main body of an image projection device; and a filter box that can be attached/detached to/from the main body, and at least covers an air inlet of the main body. A box-side filter provided for the filter box has a total area larger than an area of a main body filter provided at the air inlet of the main body.

Moreover, according to the present disclosure, there is provided a filter box that can be attached/detached to/from a main body of an image projection device, including: a filter that at least covers an air inlet of the main body, and has a total area larger than an area of a main body filter provided at the air inlet of the main body.

Advantageous Effects of Invention

According to the present disclosure as described above, it is possible to reduce the frequency of filter replacement and to extend the life of an image projection device main body. Note that the effects described above are not necessarily limitative. With or in the place of the above effects, there may be achieved any one of the effects described in this specification or other effects that may be grasped from this specification.

MODE(S) FOR CARRYING OUT THE INVENTION

Figure 1:
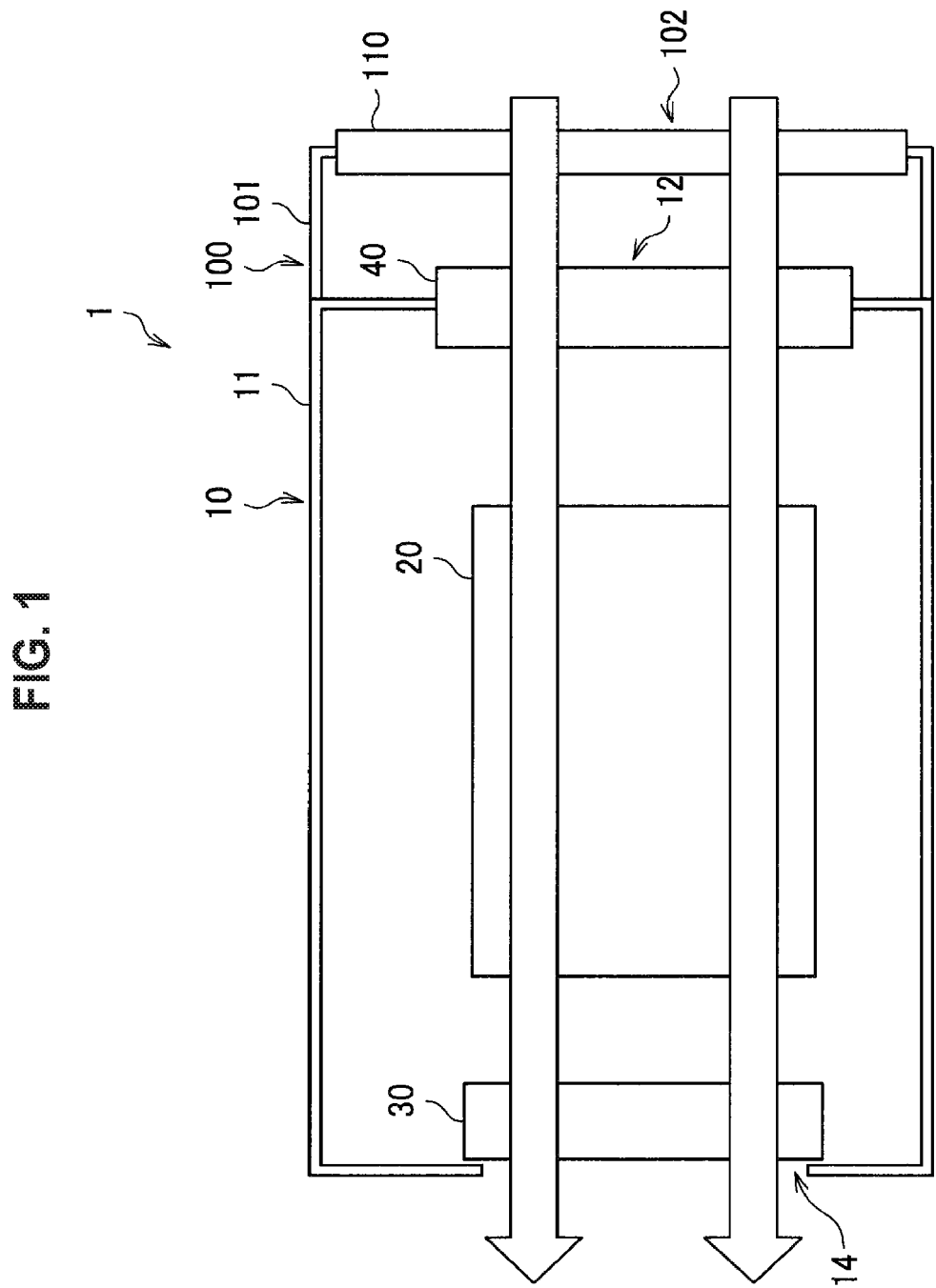
FIG. 1 is a schematic view showing a schematic configuration according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that description will be provided in the following order.

1. Overview
2. First embodiment (filter box: protruding in one direction, cuboid)
3. Second embodiment (filter box: protruding in one direction, increase of area of surface in which air inlet is formed)
4. Third embodiment (filter box: protruding in two directions)
5. Variations
5.1. Adjustment of filter density
5.2. Installation of fan
5.3. Installation of cooling mechanism
6. Conclusion

1. Overview

First, a schematic configuration of an image projection unit 1 according to an embodiment of the present disclosure will be described with reference to FIG. 1. FIG. 1 is a schematic view showing a schematic configuration of the image projection unit 1 according to the present embodiment. The image projection unit 1 according to the present embodiment includes a projector 10 which is an image projection device and a filter box 100 that can be attached/detached to/from the projector 10, as shown in FIG. 1.

The projector 10 is an example of an image projection device that projects and displays an image on a screen or the like, for example. The display system of the projector 10 according to the present embodiment is not particularly limited, but projectors of various systems, such as the 3 liquid crystal display (LCD) system, DLP system, and liquid crystal on silicon (LCOS) system, are assumed, for example. For example, in the projector of the 3LCD system, an image to be projected on a display surface of the screen or the like is generated by separating white light output from a light source device which is a light source part into three primary colors of red, green, and blue for transmission through three LCDs, respectively. The projector of the 3LCD system includes an optical modulation synthesis system component that modulates and synthesizes incident light, such as a liquid crystal panel or a dichroic prism, an illumination optical system component that guides light from a light source device to a liquid crystal panel, such as a reflective dichroic mirror or a reflective mirror, a projection optical system component that projects an image output from a dichroic prism, and the like, for example. In FIG. 1, various devices constituting the projector 10, including a power supply substrate, a signal processing substrate, a light source, an optical condensing system, and the like, are shown as a component 20.

The projector 10 has the component 20 arranged within an enclosure 11, as shown in FIG. 1. An image generated by the component 20 is output from the enclosure 11 to a projection plane through a lens. The projector 10 is provided with a cooling fan 30 that exhausts air within the enclosure 11 via an exhaust port 14 in order to suppress temperature increase within the enclosure 11 due to heat generation of the light source, a power source, or the like, and to prevent a failure of equipment and degradation of optical components. When the cooling fan 30 operates, outside air is taken in into the enclosure 11 via an air inlet 12. On this occasion, in order to prevent dust intrusion into the enclosure 11, a filter 40 is provided at the air inlet 12 of the enclosure 11. Note that FIG. 1 is a schematic view, and a fan may be installed at another opening (not shown) of the enclosure 11 besides the filter 40 shown in FIG. 1 to assist in exhausting air within the enclosure 11. In addition, hereinafter, the filter 40 provided for the projector 10 will also be referred to as a "main body filter".

The filter box 100 is a filter mechanism including a filter 110 at a box air inlet 102 formed in a box enclosure 101, and is provided at least in a manner covering the air inlet 12 of the main body of the projector 10. Hereinafter, the filter 110 provided for the filter box 100 will also be referred to as a "box-side filter".

The box-side filter 110 is designed so as to have a total area larger than the area of the main body filter 40 of the projector 10. Accordingly, in the filter box 100, since the area in which cooling air to be taken in into the projector 10 passes is larger than at the projector 10 side, the box-side filter 110 is less likely to clog, and can have a longer life. As a result, the frequency of replacement of the box-side filter 110 can be reduced.

In addition, by providing the filter box 100, part of dust can be removed at the box-side filter 110 before cooling air is taken in via the air inlet 12 of the projector 10. Consequently, intrusion of dust or the like into the projector 10 can further be reduced, and the life of the projector 10 can also be extended.

The filter box 100 can be attached/detached to/from the main body, and can be installed in the projector 10 in accordance with a user's selection. Thus, the user can also select as appropriate the shape and function of the filter box 100 in accordance with the installed position of the projector 10, installation environment, or the like. Hereinafter, each form of the filter box 100 will be described.

2. First Embodiment

Figure 2:
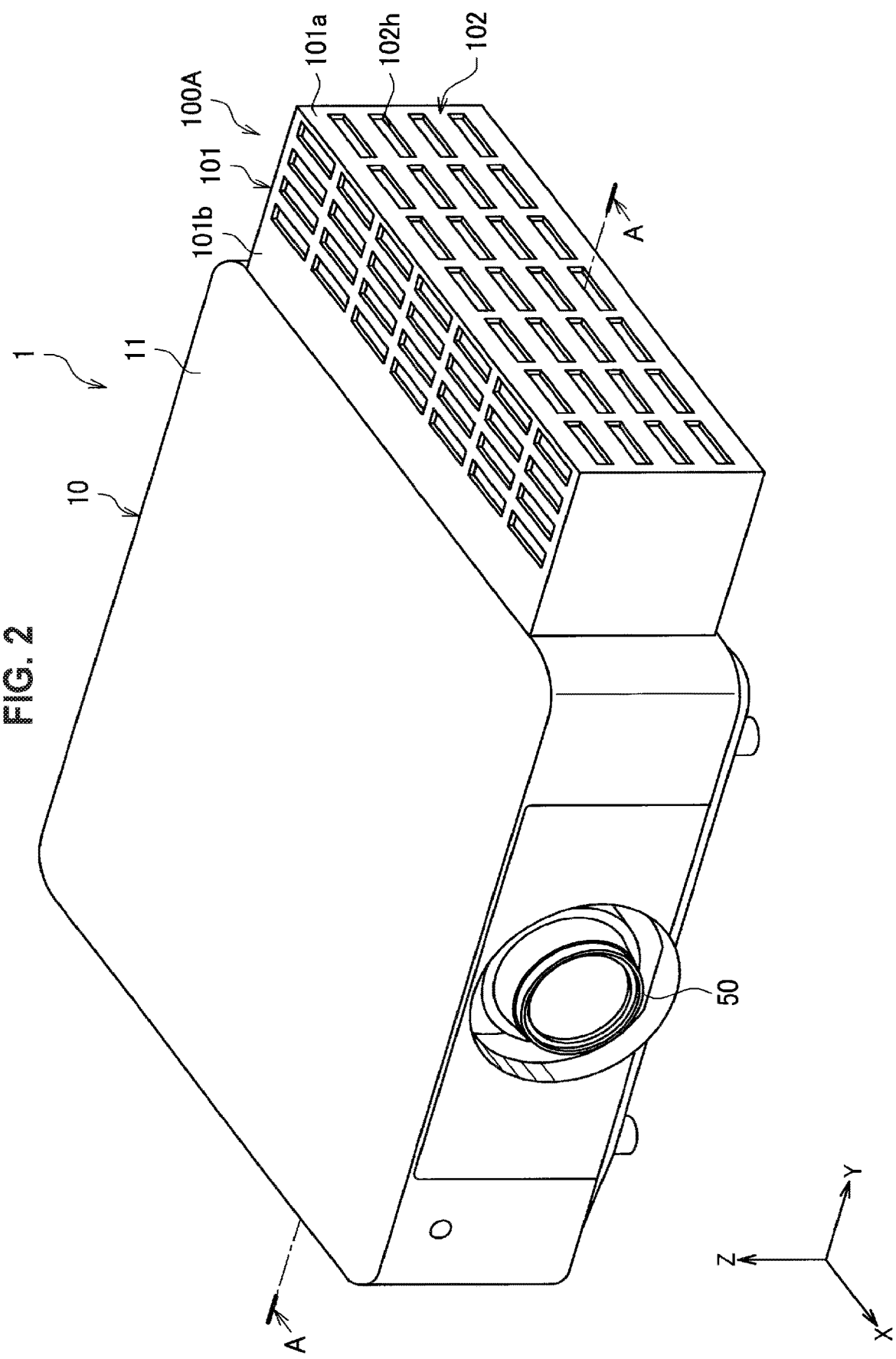
FIG. 2 is a perspective view showing an appearance of an image projection unit according to a first embodiment of the present disclosure.
Figure 3:
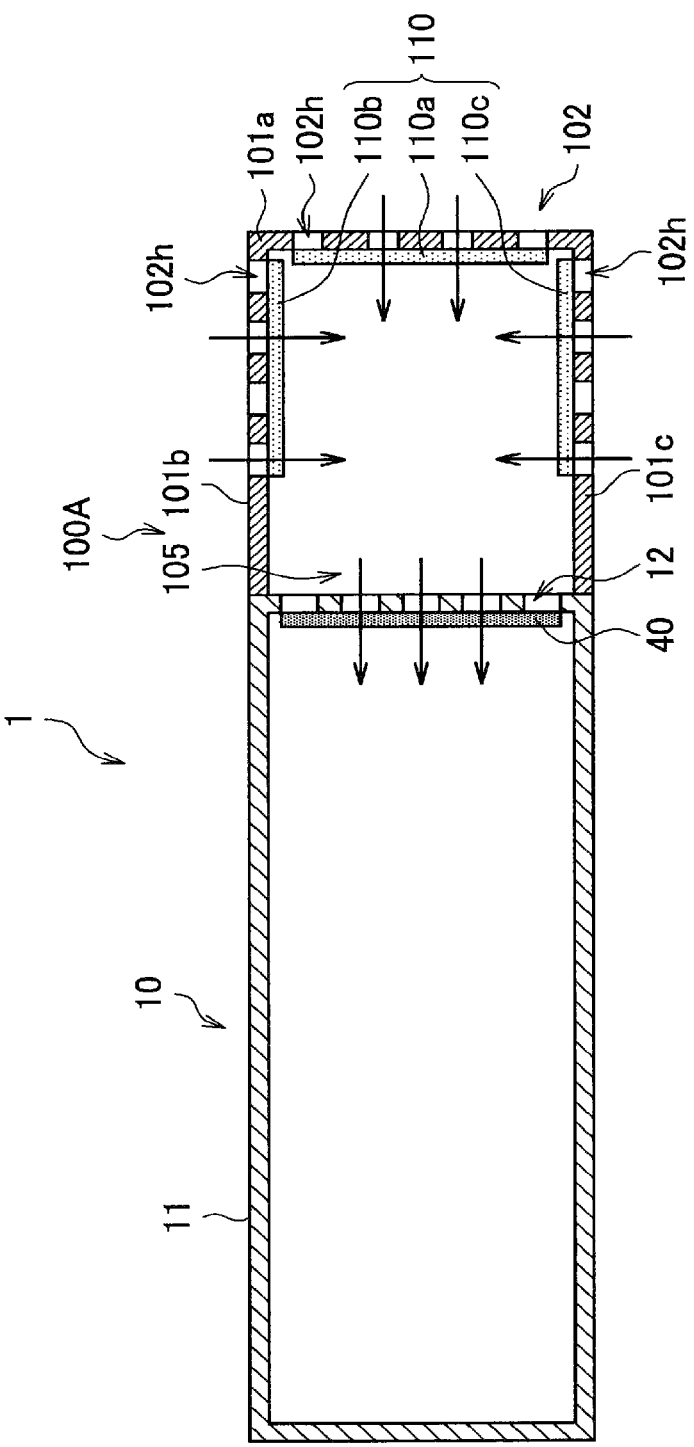
FIG. 3 is a schematic view showing a cross section taken along the cutting line A-A in FIG. 2.

First, on the basis of FIG. 2 and FIG. 3, a configuration of the image projection unit 1 according to the first embodiment of the present disclosure will be described. FIG. 2 is a perspective view showing an appearance of the image projection unit 1 according to the present embodiment. FIG. 3 is a schematic view showing a cross section taken along the cutting line A-A in FIG. 2.

The image projection unit 1 according to the present embodiment includes the projector 10 and a filter box 100A as shown in FIG. 2. The projector 10 shown in FIG. 2 shows a configuration in the case of usage in a manner mounted on a table, whilst the installed place of the projector 10 is not limited to such an example. For example, also in the case of usage in a manner suspended from the ceiling or stored in a shelf or the like, it is sufficient if a filter box suitable for each installed place is attached to the projector. The projector 10 shown in FIG. 2 has the component 20 housed in the enclosure 11 having a generally cuboid shape whose upper surface and bottom surface have a large area, and projects an image on a projection plane through a projection part 50. A surface on the side where the projection part 50 is provided is assumed as the front surface. In addition, an air inlet that draws in outside air is provided in a side surface (a surface on the Y-axis positive direction side in FIG. 2) of the enclosure 11 of the projector 10. The filter box 100A is attached to the projector 10 in a manner covering this air inlet.

The filter box 100A according to the present embodiment has a generally cuboid shape, and is attached so as to protrude from a side surface of the enclosure 11 of the projector 10. The filter box 100A is provided such that the longitudinal direction (X direction) extends along a side surface of the enclosure 11 of the projector 10, and substantially covers the side surface. The height (length in the Z direction) of the filter box 100A can be set as appropriate, whilst by causing the height of the filter box 100A to correspond to the height of the enclosure 11 of the projector 10, the air inlet 12 can be covered reliably, and the appearance is also improved. The protruding length (length in the Y direction) of the filter box 100A can also be set as appropriate, but may be set considering a necessary area of the box air inlet 102 or the allowable size or the like of the image projection unit 1 when attached to the projector 10, for example.

In the filter box 100A, a surface of the box enclosure 101 having a generally cuboid shape is open to become an opening 105 that covers the air inlet 12 of the projector 10 as shown in FIG. 3. The opening area of the opening 105 is preferably larger than or equal to the opening area of the air inlet 12 of the projector 10. In at least part of the surfaces except the surface (the entire surface is open in the filter box 100A shown in FIG. 3 to become the opening 105) in which the opening 105 is provided, the box air inlet 102 that passes outside air into the filter box 100A and the box-side filter 110 provided in correspondence with the box air inlet 102 are provided.

The box air inlet 102 may include a plurality of holes 102h, for example, as shown in FIG. 2. In the present embodiment, the plurality of holes 102h is provided in a surface 101a opposite to the opening 105, an upper surface 101b, and a bottom surface 101c. That is, the box air inlet 102 is provided in the three surfaces 101a, 101b, and 101c of the box enclosure 101. The box-side filter 110 is provided in correspondence with the box air inlet 102 in the surface 101a opposite to the opening 105, the upper surface 101b, and the bottom surface 101c, and includes filters 110a, 110b, and 110c in the present embodiment.

By providing the filter box 100A so as to protrude from a side surface of the projector 10 as in the image projection unit 1 according to the present embodiment, a surface area larger than the opening area of the air inlet 12 of the projector 10 can be ensured in the filter box 100A. As a result, the opening area of the box air inlet 102 of the filter box 100A can be made larger than the opening area of the air inlet 12 of the projector 10. Here, the opening area of the box air inlet 102 is assumed as the sum of the opening areas of the holes 102h formed in the filter box 100A. In the present embodiment, the box air inlet 102 is provided not only in the surface 101a opposite to the opening 105 corresponding to the air inlet 12 of the projector 10, but also in the upper surface 101b and the bottom surface 101c, so that an opening area larger than that of the air inlet 12 of the projector 10 is ensured. Accordingly, since the area in which cooling air to be taken in into the projector 10 passes is enlarged, the box-side filter 110 is less likely to clog, so that the life of the box-side filter 110 can be extended, and the frequency of replacement of the filter 110 can also be reduced.

Then, it is also possible to set the total area (that is, the sum of the areas of the respective filters 110a, 110b, and 110c) of the box-side filter 110 larger than the area of the main body filter 40 provided for the projector 10. Accordingly, since dust is less likely to adhere to the box-side filter 110, and the pressure loss can also be reduced, passage of cooling air to be taken in into the projector 10 is no longer inhibited.

Cooling air passed through the box-side filter 110 via the box air inlet 102 and taken in into the box flows to the air inlet 12 of the projector 10 that communicates with the opening 105 of the filter box 100A. On this occasion, since cooling air passed through the filter box 100A is taken in into the projector 10, dust contained in the cooling air is less than in the case of taking in outside air directly. Consequently, clogging of the main body filter 40 of the projector 10 can also be suppressed to extend the life, and the frequency of replacement of the main body filter 40 can also be reduced.

The image projection unit 1 according to the first embodiment has been described above. According to the present embodiment, the filter box 100A is provided so as to protrude from a surface in which the air inlet 12 is formed so as to cover the air inlet 12 of the main body of the projector 10. Accordingly, it is possible to ensure an opening area larger than that of the air inlet 12 of the projector 10 with the box air inlet 102 of the filter box 100A, and the total area of the box-side filter 110 can be made larger than the area of the main body filter 40 of the projector 10. Accordingly, since dust is less likely to adhere to the box-side filter 110, and the pressure loss can also be reduced, passage of cooling air to be taken in into the projector 10 is no longer inhibited. In addition, intrusion of dust or the like into the projector 10 itself can be prevented, so that the life of the projector 10 can also be extended.

Further, by making the filter box 100A attachable/detachable to/from the projector 10, the user can select installation of the filter box 100A. As a result, it is not necessary to provide the projector 10 with unnecessary functions, and a cost increase that would be caused by providing the functions can also be avoided.

Note that the filter box 100A shown in FIG. 2 and FIG. 3 is provided with the box air inlet 102 in the three surfaces of the surface 101a opposite to the opening 105 of the box enclosure 101, the upper surface 101b, and the bottom surface 101c, whilst the present disclosure is not limited to such an example. It is sufficient if the box air inlet 102 has an opening area larger than the opening area of the air inlet 12 of the projector 10, and the position and the number of surfaces in which the box air inlet 102 is formed are not particularly limited. In addition, the opening of the box air inlet 102 is formed by the plurality of holes 102h, whilst the opening shape and the opening area are not particularly limited.

The shape of the filter box 100A according to the first embodiment may be utilized in the case where space in the height direction of the projector 10 is restricted, or the like, for example.

3. Second Embodiment

Figure 4:
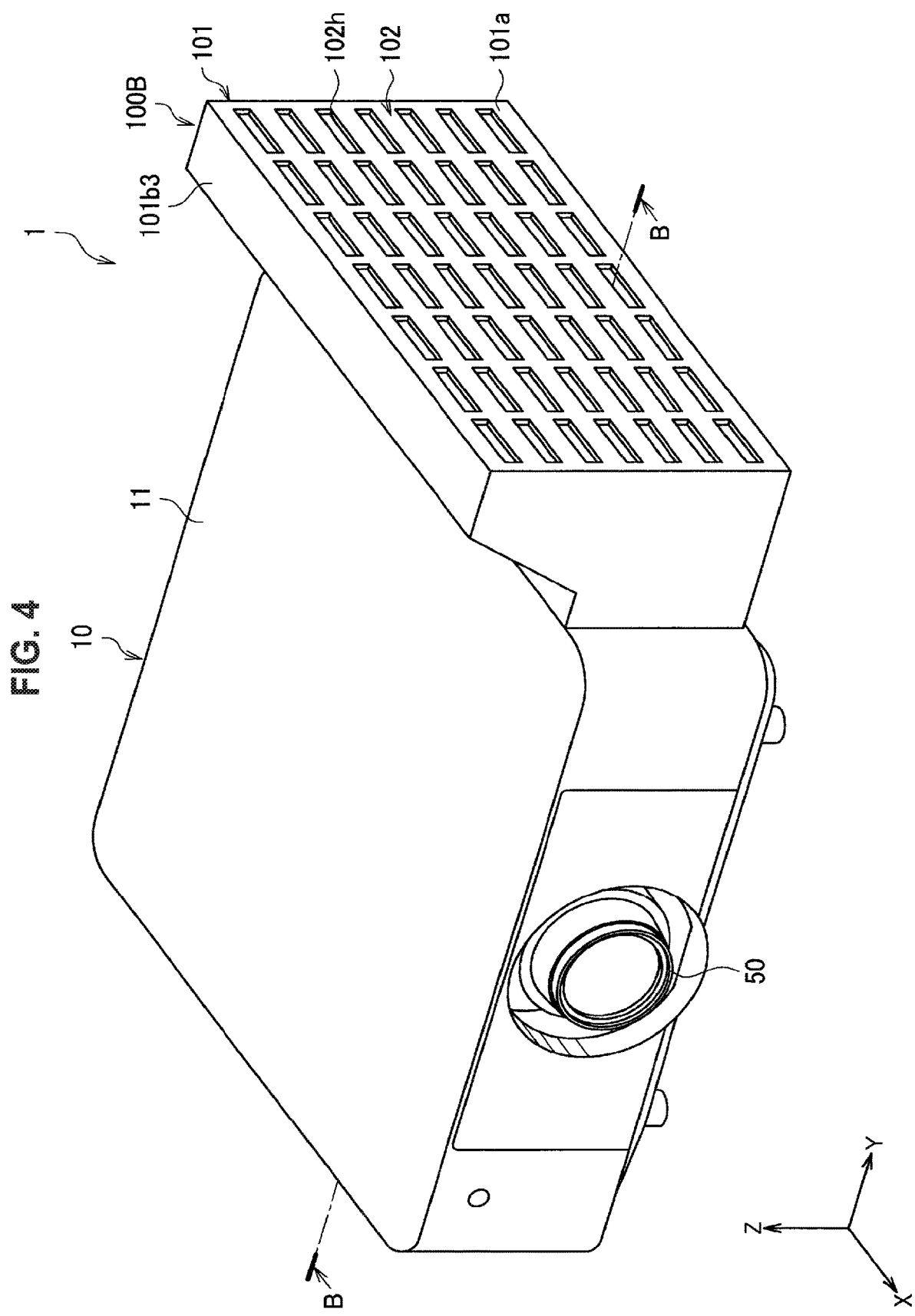
FIG. 4 is a perspective view showing an appearance of an image projection unit according to a second embodiment of the present disclosure.
Figure 5:
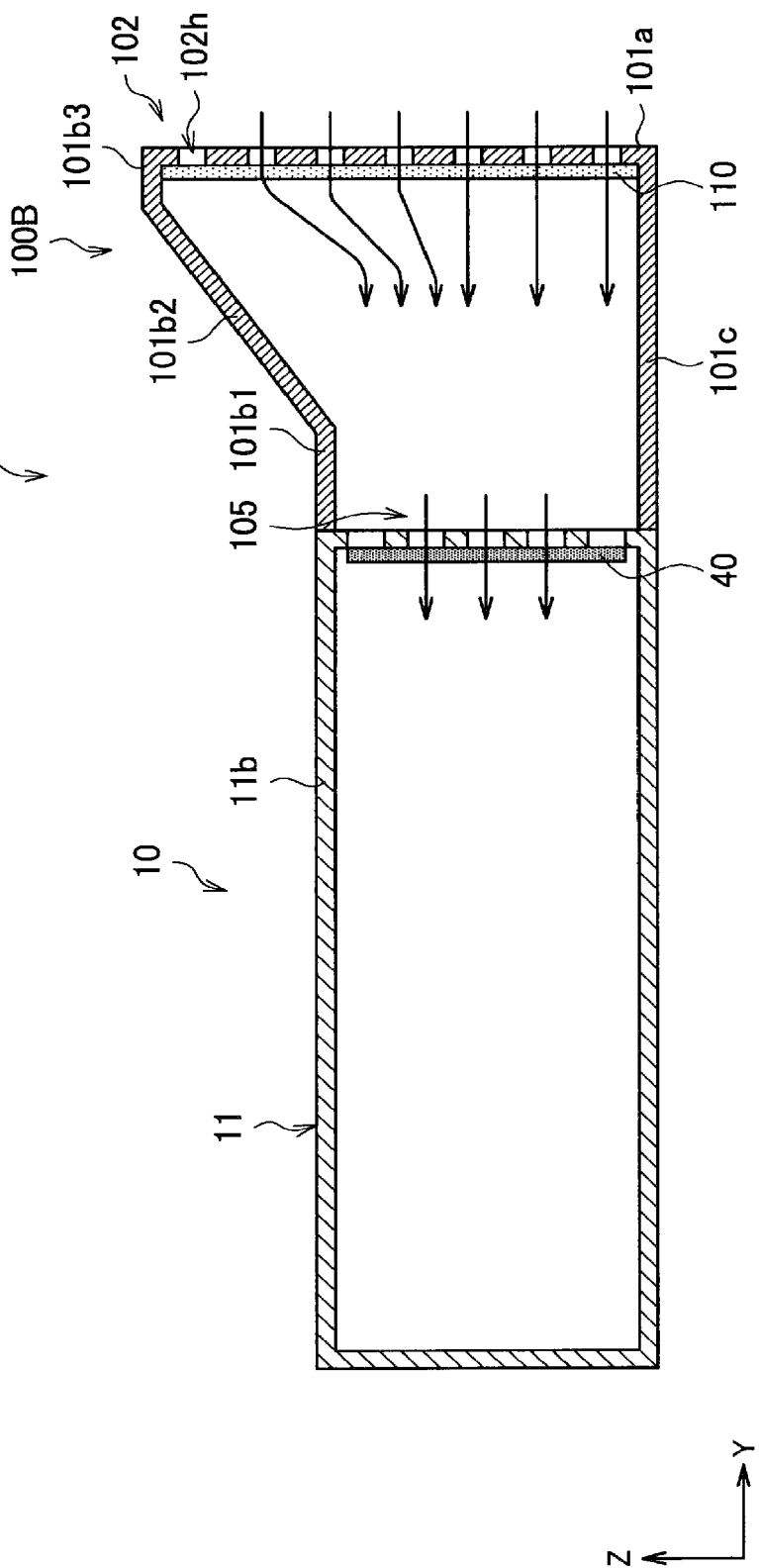
FIG. 5 is a schematic view showing a cross section taken along the cutting line B-B in FIG. 4.

Next, a configuration of the image projection unit 1 according to a second embodiment of the present disclosure will be described on the basis of FIG. 4 and FIG. 5. FIG. 4 is a perspective view showing an appearance of the image projection unit 1 according to the present embodiment. FIG. 5 is a schematic view showing a cross section taken along the cutting line B-B in FIG. 4.

The image projection unit 1 according to the present embodiment includes the projector 10 and a filter box 100B as shown in FIG. 4. The projector 10 shown in FIG. 4 also shows a configuration in the case of usage in a manner mounted on a table similarly to the first embodiment, whilst the installed place of the projector 10 is not limited to such an example. An air inlet that draws in outside air is provided in a side surface (a surface on the Y-axis positive direction side in FIG. 4) of the enclosure 11 of the projector 10. The filter box 100B is attached to the projector 10 in a manner covering this air inlet.

The filter box 100B according to the present embodiment has the opening 105 that covers the air inlet 12 of the projector 10, the box air inlet 102, and the box-side filter 110 as shown in FIG. 5, similarly to the filter box 100A of the first embodiment. However, the filter box 100B according to the present embodiment differs from the filter box 100A of the first embodiment in that the area of the surface 101a opposite to the opening 105 is larger than the opening area of the opening 105. That is, the filter box 100B has a shape whose cross section is enlarged from the opening 105 on the projector 10 side toward the box air inlet 102 side, as shown in FIG. 4 and FIG. 5.

For example, the upper surface 101b of the box enclosure 101 may be inclined to the upper side (the Z-axis positive direction side) with distance from the opening 105 side to enlarge the area of the surface 101a opposite to the opening 105. Specifically, the upper surface 101b includes a first flat part 101b1 flush with an upper surface 11b of the projector 10 and an inclined part 101b2 inclined to the upper side with distance from the first flat part 101b1. In addition, in order to facilitate installing the box-side filter 110, a second flat part 101b3 extending generally in parallel with the bottom surface 101c from a side of the inclined part 101b2 on the opposite side of the first flat part 101b1 may be provided.

In this manner, by causing the filter box 100B to protrude from a side surface of the projector 10 to enlarge the area of the surface 101a opposite to the opening 105, the box air inlet 102 whose opening area is larger than the air inlet 12 of the projector 10 can be formed in the surface 101a. Accordingly, since the area in which cooling air to be taken in into the projector 10 passes increases, the box-side filter 110 is less likely to clog, so that the life of the box-side filter 110 can be extended, and the frequency of replacement of the filter 110 can also be reduced. Of course, the box air inlet 102 may be provided in a surface other than the surface 101a opposite to the opening 105 as in the first embodiment. In addition, it is sufficient if the box air inlet 102 has an opening area larger than the opening area of the air inlet 12 of the projector 10, and the position and the number of surfaces in which the box air inlet 102 is formed are not particularly limited. The opening of the box air inlet 102 is also formed by the plurality of holes 102h, whilst the opening shape and the opening area are not particularly limited.

Then, it is also possible to set the total area of the box-side filter 110 larger than the area of the main body filter 40 provided for the projector 10. Accordingly, since dust is less likely to adhere to the box-side filter 110, and the pressure loss can also be reduced, passage of cooling air to be taken in into the projector 10 is no longer inhibited.

Cooling air passed through the box-side filter 110 via the box air inlet 102 and taken in into the box flows to the air inlet 12 of the projector 10 that communicates with the opening 105 of the filter box 100B. On this occasion, since cooling air passed through the filter box 100B is taken in into the projector 10, dust contained in the cooling air is less than in the case of taking in outside air directly. Consequently, clogging of the main body filter 40 of the projector 10 can also be suppressed to extend the life, and the frequency of replacement of the main body filter 40 can also be reduced.

Further, by making the filter box 100B attachable/detachable to/from the projector 10, the user can select installation of the filter box 100B. As a result, it is not necessary to provide the projector 10 with unnecessary functions, and a cost increase that would be caused by providing the functions can also be avoided.

Note that the filter box 100B is provided such that the longitudinal direction (X direction) extends along a side surface of the enclosure 11 of the projector 10, and substantially covers the side surface. The protruding length (length in the Y direction) of the filter box 100B can also be set as appropriate, and may be set considering a necessary area of the box air inlet 102 or the allowable size of the image projection unit 1 when attached to the projector 10 or the like, for example. The height (length in the Z direction) of the filter box 100B can be set as appropriate, and the opening 105 side may be caused to correspond to the height of the enclosure 11 of the projector 10, and the side opposite to the opening 105 may be set considering the allowable size of the image projection unit 1 or the like.

4. Third Embodiment

Figure 6:
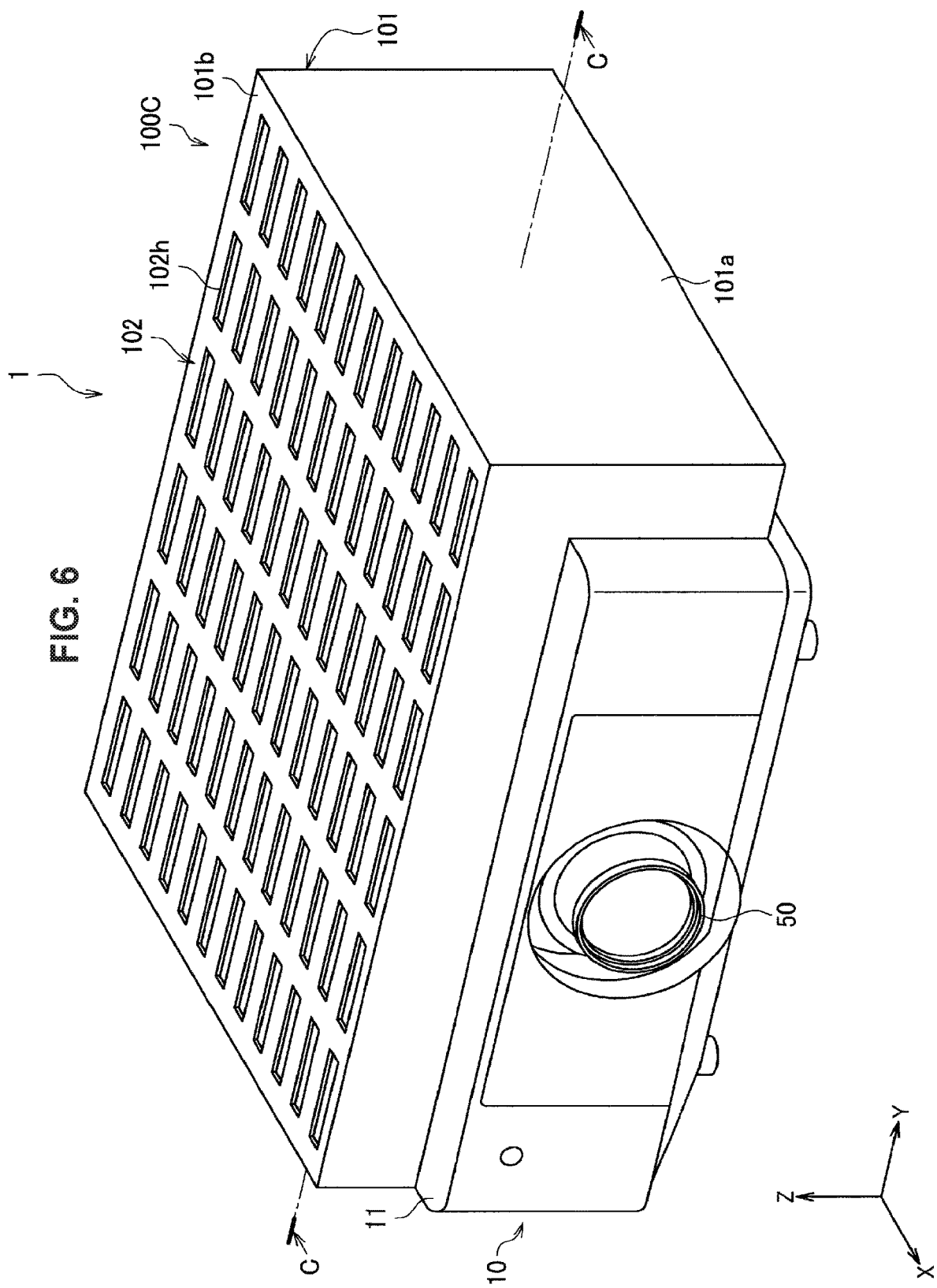
FIG. 6 is a perspective view showing an appearance of an image projection unit according to a third embodiment of the present disclosure.
Figure 7:
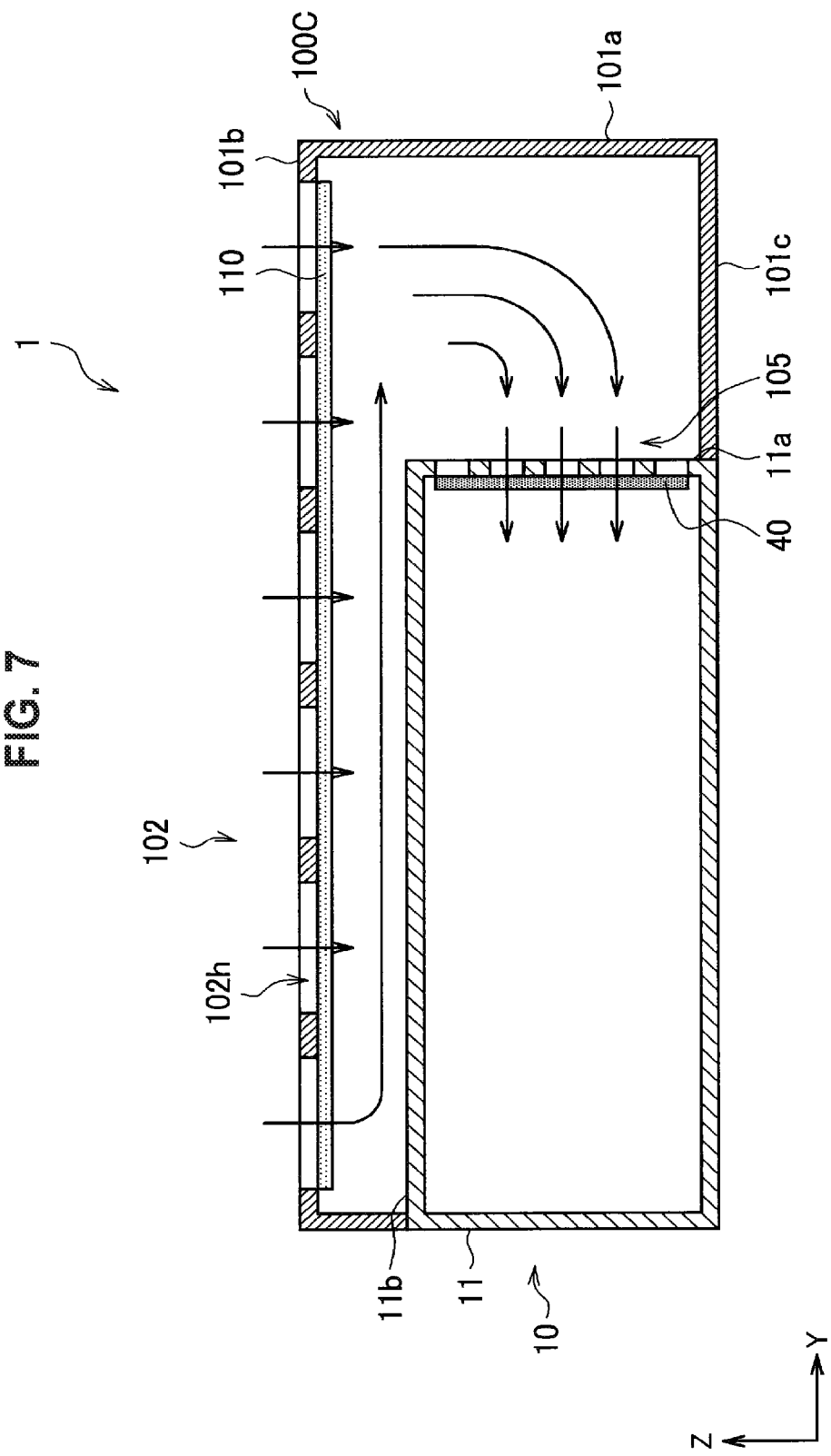
FIG. 7 is a schematic view showing a cross section taken along the cutting line C-C in FIG. 6.

Next, a configuration of the image projection unit 1 according to a third embodiment of the present disclosure will be described on the basis of FIG. 6 and FIG. 7. FIG. 6 is a perspective view showing an appearance of the image projection unit 1 according to the present embodiment. FIG. 7 is a schematic view showing a cross section taken along the cutting line C-C in FIG. 6.

The image projection unit 1 according to the present embodiment also includes the projector 10 and a filter box 100C as shown in FIG. 6, similarly to the first and second embodiments. The projector 10 shown in FIG. 6 also shows a configuration in the case of usage in a manner mounted on a table similarly to the first and second embodiments, whilst the installed place of the projector 10 is not limited to such an example. An air inlet that draws in outside air is provided in a side surface (a surface on the Y-axis positive direction side in FIG. 6) of the enclosure 11 of the projector 10. The filter box 100C is attached to the projector 10 in a manner covering this air inlet.

The filter box 100C according to the present embodiment has such a shape that covers not only the surface in which the air inlet 12 of the projector 10 is provided, but further at least one more surface. Specifically, when looking at the projector 10 from the front surface (the projection part 50 side) as shown in FIG. 6 and FIG. 7, the filter box 100C has an L-shaped sectional shape that covers the side surface and the upper surface of the projector 10 in which the air inlet 12 is formed. That is, the filter box 100C has a shape protruding in two directions from the projector 10.

The filter box 100C has the opening 105 that covers the air inlet 12 of the projector 10, the box air inlet 102, and the box-side filter 110 as shown in FIG. 7, similarly to the filter boxes 100A and 100B of the first and second embodiments. In the filter box 100C, the box air inlet 102 is formed in the upper surface 101b of the filter box 100C that covers the upper surface 11b of the projector 10 when attached to the projector 10. Since the upper surface 11b of the projector 10 shown in FIG. 6 has an area larger than the area of a side surface 11a, the opening area larger than that of the air inlet 12 of the projector 10 can be ensured. Accordingly, since the area in which cooling air to be taken in into the projector 10 passes increases, the box-side filter 110 is less likely to clog, so that the life of the box-side filter 110 can be extended, and the frequency of replacement of the filter 110 can also be reduced.

Note that the box air inlet 102 is provided only in the upper surface 101b in the example shown in FIG. 6 and FIG. 7, whilst the present disclosure is not limited to such an example. For example, the box air inlet 102 may be provided in a surface that is not directly opposite to the projector 10, such as the surface 101a opposite to the opening 105, besides the upper surface 101b. In addition, it is sufficient if the box air inlet 102 has an opening area larger than the opening area of the air inlet 12 of the projector 10, and the position and the number of surfaces in which the box air inlet 102 is formed are not particularly limited. The opening of the box air inlet 102 is also formed by the plurality of holes 102h, whilst the opening shape and the opening area are not particularly limited.

Further, in the example of FIG. 6 and FIG. 7, the filter box 100C has a shape protruding in two directions from the projector 10, but may have a shape protruding in three or more directions. For example, the projector 10 may have a shape having a U-shaped cross section when the filter box is viewed from the front surface to cover the side surface in which the air inlet 12 of the projector 10 is formed, the upper surface, and the bottom surface. At this time, by forming the box air inlet 102 in the upper surface and the bottom surface of the filter box, for example, it is possible to ensure a larger opening area.

By enlarging the opening area of the box air inlet 102 in this manner, it is also possible to set the total area of the box-side filter 110 larger than the area of the main body filter 40 provided for the projector 10. Accordingly, since dust is less likely to adhere to the box-side filter 110, and the pressure loss can also be reduced, passage of cooling air to be taken in into the projector 10 is no longer inhibited.

Cooling air taken in via the box air inlet 102 formed in the upper surface 101b of the filter box 100C as shown in FIG. 6 and FIG. 7 passes through a flow path along the upper surface 101b, and flows to the surface 101a side opposite to the opening 105. Then, cooling air passes through the space between the surface 101a and the opening 105, and flows to the air inlet 12 of the projector 10 that communicates with the opening 105. On this occasion, since cooling air passed through the filter box 100C is taken in into the projector 10, dust contained in the cooling air is less than in the case of taking in outside air directly. Consequently, clogging of the main body filter 40 of the projector 10 can also be suppressed to extend the life, and the frequency of replacement of the main body filter 40 can also be reduced.

The configuration of the image projection unit 1 according to the third embodiment has been described above. According to the present embodiment, the filter box 100C is provided so as to protrude from at least two surfaces, that is, the surface in which the air inlet 12 is formed and a surface continuous to this in a manner covering the air inlet 12 of the main body of the projector 10. Accordingly, the opening area larger than that of the air inlet 12 of the projector 10 can be ensured with the box air inlet 102 of the filter box 100C, and the total area of the box-side filter 110 can be made larger than the area of the main body filter 40 of the projector 10. Accordingly, since dust is less likely to adhere to the box-side filter 110, and the pressure loss can also be reduced, passage of cooling air to be taken in into the projector 10 is no longer inhibited. In addition, intrusion of dust or the like into the projector 10 itself can be prevented, and the life of the projector 10 can also be extended.

In addition, by making the filter box 100C attachable/detachable to/from the projector 10 similarly to the first and second embodiments, the user can select installation of the filter box 100B. As a result, it is not necessary to provide the projector 10 with unnecessary functions, and a cost increase that would be caused by providing the functions can also be avoided.

5. Variations

The respective filter boxes 100A, 100B, and 100C in the above-described embodiments may have configurations as will be described below. Hereinafter, the case of application to the filter box 100B according to the second embodiment will be described as an example, whilst it is sufficient if the filter boxes 100 in the other forms are configured similarly.

5.1. Adjustment of Filter Density

The projector and the filter box that constitute the image projection unit are each provided with a filter at an air inlet. Identical filters may be utilized, respectively, whilst by appropriately setting the density of the box-side filter, the lives of the box-side filter and the filter of the projector can be optimized.

In general, as the opening area of an air inlet at which a filter is installed is larger, the air volume per unit area when transmitting the same air volume decreases, and the filter life is made longer. Consequently, if the opening area of the box air inlet of the filter box is set larger, the life of the box-side filter can be made longer. However, by further using a filter having a density lower than the main body filter as the box-side filter, it is possible to reduce dust deposition on the filter, and the life can be extended further. Note that, also in the case of setting the box-side filter at a low density, the amount of dust adhering to the main body filter is reduced as compared to the case of not installing the filter box, so that the functions of increasing the life of the main body filter and protecting the inner structure of the projector are held.

Example of Optimization of Box-Side Filter

In order to set the optimum filter density of the box-side filter, it is desired to consider various influences as indicated below.

Influence of changes in performance of optical devices due to dust intrusion into the projector
    Influence of light source degradation due to use over years
    Influence of changes in collection efficiency of filter box due to dust adhesion
    Influence of particle size of environmental dust
    Non-uniformity of dust adhesion
    Nonlinearity of correlation between various elements However, in order to set the filter density considering the above-described influences, complicated simulation or experiment is required. Therefore, simplification may be performed as described below to determine the optimum filter density of the box-side filter.

As a preposition, assume the density of the main body filter of the projector as q1, and the density of the box-side filter of the filter box as q2. The flow rate is a function depending on the filter density and dust adhesion amount, whilst it is assumed here that the fan mechanism of the projector main body has sufficient performance, and that a flow rate Q is always constant.

First, dust adhesion amounts (G) of the box-side filter and the main body filter are defined by Expressions (1) and (2) below. K is assumed as a coefficient representing the dust adhesion degree of the filter.

Dust adhesion amount of the box-side filter:

$$G2 = \int K * q2 * Q \, dt \tag{1}$$

Dust adhesion amount of the main body filter:

$$G1 = \int K * q1 * Q \, dt - G2 \tag{2}$$

Here, respective filter lives are defined as filter lives when the dust adhesion amount per unit area becomes G0. Assuming the area of the main body filter as α1, and the area of the box-side filter as α2, the respective filter lives are reached when Expressions (3) and (4) below are met. Note that it is assumed here that the main body filter and the box-side filter are flat, and have areas identical to the opening area of the air inlet of the projector and the opening area of the box air inlet, respectively.

$$G1/\alpha 1 = G0 \quad (3)$$

$$G2/\alpha 2 = G0 \quad (4)$$

When substituting Expressions (1) and (2) into Expressions (3) and (4) above, and organizing them as indicated below, a main body filter life T1 and a box-side filter life T2 are expressed by Expressions (5) and (6) below.

$$G0*\alpha 1 = G1 = \int K*q1*Qdt - G2$$
$$= (K*q1*Q)*T - G2$$

$$G0*\alpha 2 = G2 = \int K*q2*Qdt$$
$$= (K*q2*Q)*T$$

$$G0 = K*Q/\alpha 1*(q1-q2)*T1$$

$$T1 = G0*\alpha 1/((K*Q*(q1-q2))) \quad (5)$$

$$T2 = G0*\alpha 2/(K*Q*q2) \quad (6)$$

Here, in the image projection unit, it is desirable that the life of the filter having a longer life between the box-side filter and the main body filter is maximized, that is, both filter lives become identical. Therefore, organizing the mathematic expression of T1=T2 on the basis of Expressions (5) and (6) above, Expression (7) below is obtained.

$$\alpha 1*q2 = \alpha 2*(q1-q2) \quad (7)$$

Thus, the optimum value of the filter density of the box-side filter is expressed by Expression (8) below. The filter life T1 (=T2) at this time will be Expression (9) below. It is understood from Expression (9) that, as the area $\alpha 2$ of the box-side filter increases, the filter life is extended.

$$q2 = \alpha 2/(\alpha 1 + \alpha 2)*q1 \quad (8)$$

$$T1 = T2 = G0/(K*Q/q1)*(\alpha 1 + \alpha 2) \quad (9)$$

Figure 8:
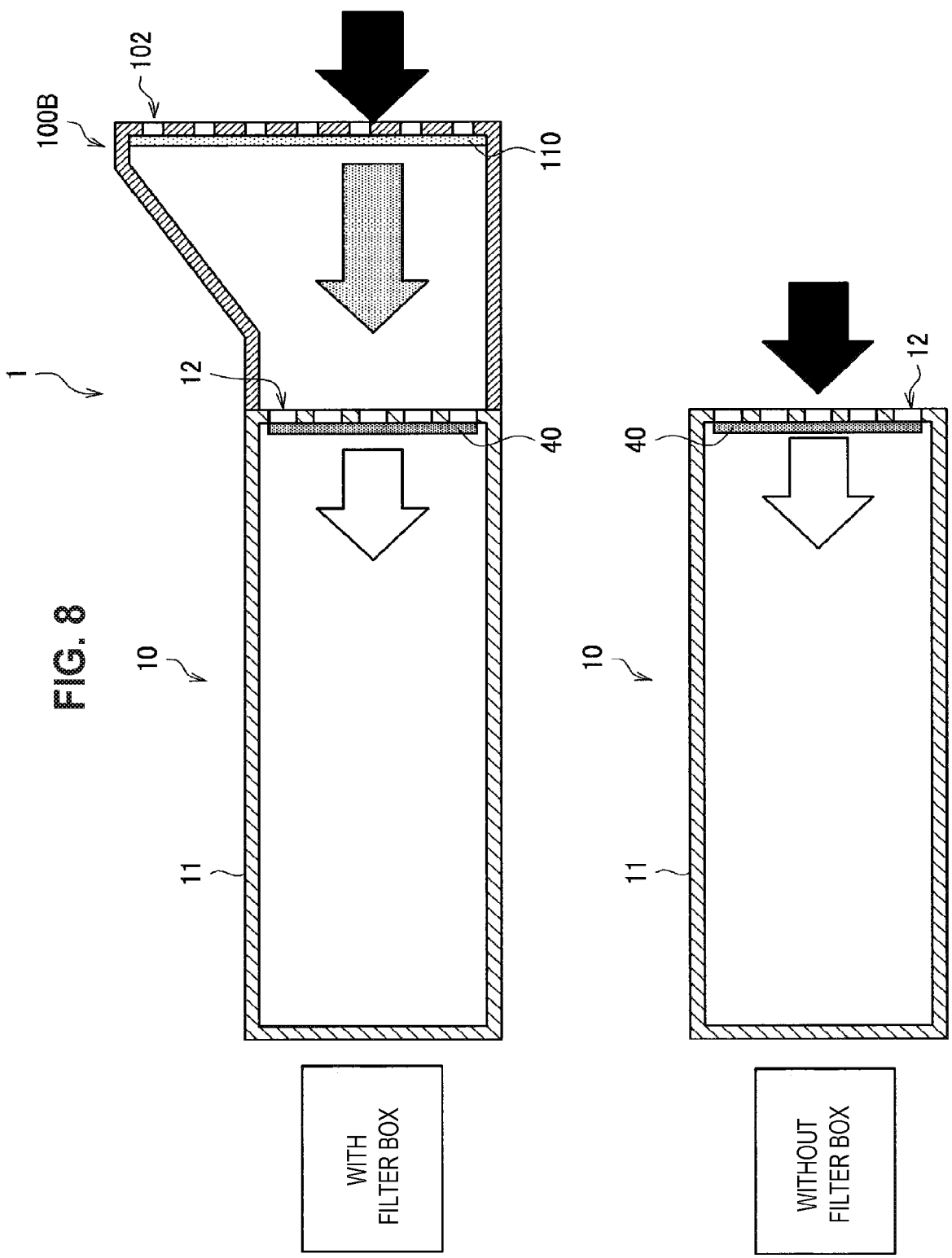
FIG. 8 is an explanatory diagram for describing a filter density relation between a box-side filter and a main body filter, as well as the filter life depending on presence/absence of a filter box.

For example, as shown at the upper side in FIG. 8, the case of attaching the filter box 100B according to the second embodiment to the projector 10 is considered. At this time, the filter density q2 of the box-side filter 110 can be determined from the filter density q1 of the main body filter 40, the opening area $\alpha 1$ of the air inlet 12 of the projector 10, and the opening area $\alpha 2$ of the box air inlet 102. In this manner, by making the filter density q2 of the box-side filter 110 lower than the filter density q1 of the main body filter 40, the life of the box-side filter 110 can be made longer than in the case of making the filter density q2 of the box-side filter 110 identical to the filter density q1 of the main body filter 40.

As a comparison, a filter life T0 of the main body filter 40 of the projector 10 in the case where the filter box 100B is not attached as shown at the lower side in FIG. 8 is expressed by Expression (10) below.

$$T0 = G0*\alpha 1/(K*Q*q1) \quad (10)$$

Here, when comparing filter lives of the main body filter 40 of the projector 10 depending on whether or not the filter box 100B is attached, a difference (T1−T0) in filter life as in Expression (11) below is obtained from Expressions (5) and (10) above. That is, it is understood that, even if a filter box having any opening area is attached, the effect of extending the life can be obtained.

$$T1 - T0 = G0/(K*Q*q1)*\alpha 2 \quad (11)$$

In addition, as an example, in the case where a filter box in which the filter area of the box-side filter is double the filter area of the main body filter is attached to the projector, the density optimum value of the box-side filter is expressed by Expression (12) below. In this case, it is optimum that the filter density of the box-side filter is ⅔ of the filter density of the main body filter. In addition, it is understood that the filter life of the main body filter at this time is expressed by Expression (13) and the life is extended threefold.

$$q2 = \alpha 2/(\alpha 1 + \alpha 2)*q1 = 2/3*q1 \quad (12)$$

$$T1 = T2 = G0/(K*Q/q1)*(\alpha 1 + \alpha 2) \quad (13)$$
$$= 3*G0/(K*Q/q1)*\alpha 1$$
$$= 3*T0$$

5.2. Installation of Fan

Figure 9:
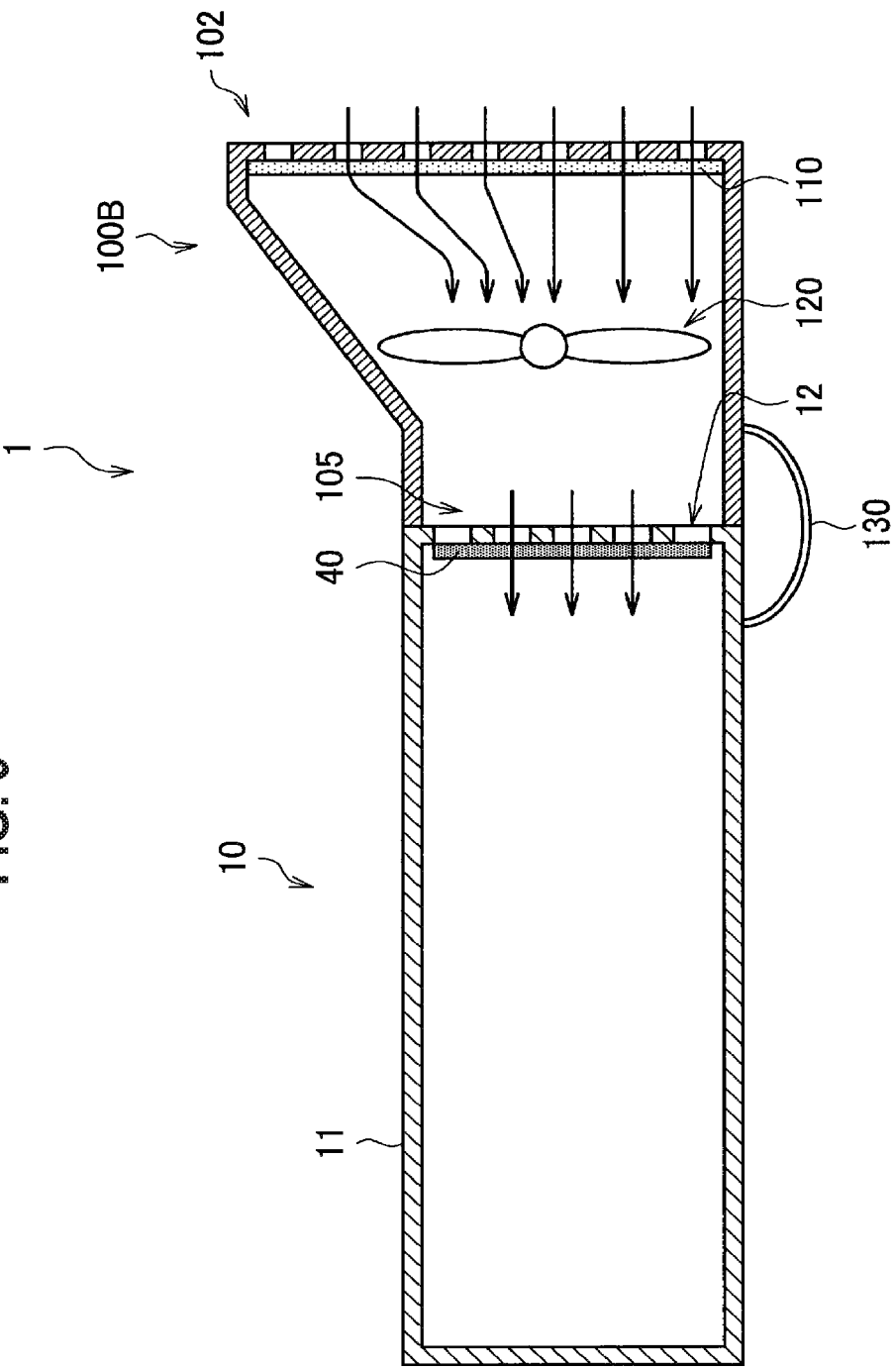
FIG. 9 is an explanatory diagram showing an exemplary configuration in which the filter box is provided with a fan.

In the image projection unit 1 according to the above-described embodiments, a fan may be provided in the filter box 100 such that cooling air is taken in into the projector 10 efficiently. By providing a fan 120 between the box air inlet 102 and the opening 105 of the filter box 100B as shown in FIG. 9, for example, outside air can be taken in actively via the box air inlet 102. As a result, sufficient cooling air can be sent into the main body of the projector 10 via the air inlet 12 of the projector 10 that communicates with the opening 105.

The fan 120 of the filter box 100B may be supplied with power and driven by being connected to the projector 10 with an interconnect line 130. Note that the connection between the filter box 100B and the projector 10 may be a wired connection or a wireless connection.

In addition, control of driving of the fan 120 of the filter box 100B may be performed automatically in conjunction with not only power supply but also the state of connection with the projector 10. For example, when the filter box 100B and the projector 10 are brought into a connected state, the fan 120 may rotate automatically upon receiving signal supply from the projector 10, and may be stopped rotating automatically when the power supply of the projector 10 is turned off. Alternatively, in the case where the internal temperature of the projector 10 is higher than or equal to a predetermined temperature even if the cooling fan (not shown) within the projector 10 is driven to the maximum extent, the fan of the filter box 100B may be driven. In this manner, it is also possible to utilize the fan 120 as a function of supporting cooling of the main body of the projector 10.

Further, by driving the fan 120 of the filter box 100B by power supply from the projector 10, it is not necessary to provide a socket or the like for the filter box, and a simple configuration can be achieved.

5.3. Installation of Cooling Mechanism

Figure 10:
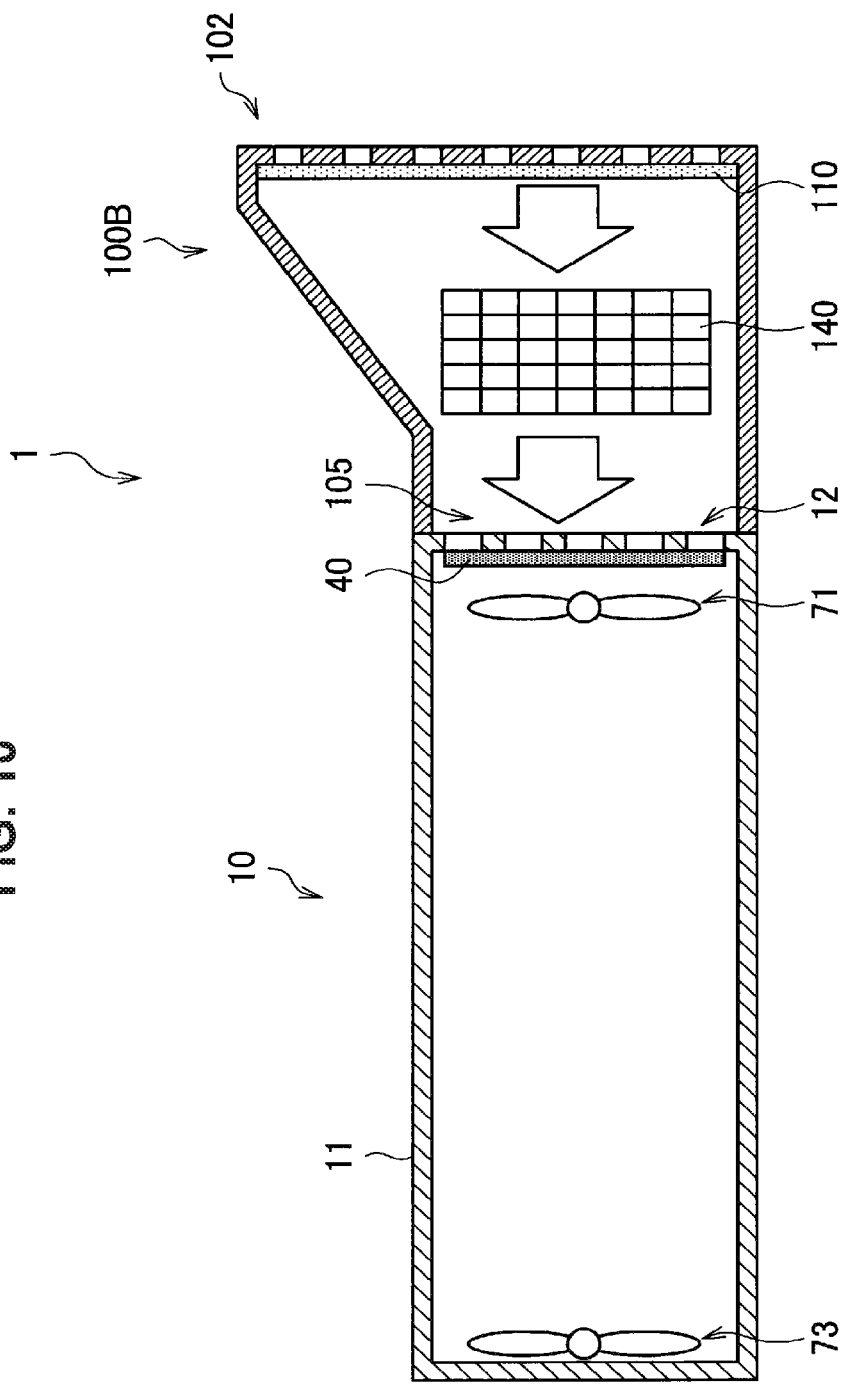
FIG. 10 is an explanatory diagram showing an exemplary configuration in which the filter box is provided with a cooling mechanism.

Further, in the image projection unit 1 according to the above-described embodiments, the filter box 100 may be provided with a cooling mechanism to supply cooling air lower than the outside temperature to the projector 10. As shown in FIG. 10, for example, a cooling mechanism 140 is provided between the box air inlet 102 and the opening 105 of the filter box 100B. As the cooling mechanism 140, a Peltier element or the like, for example, may be used. The cooling mechanism 140 may be driven by power supply from the projector 10, similarly to the above-described fan 120. Further, control of driving of the cooling mechanism 140 of the filter box 100B may be performed automatically in conjunction with the state of connection with the projector 10. For example, when the filter box 100B and the projector 10 are connected, the cooling mechanism 140 of the filter box 100B may be driven to reduce driving of a main body cooling mechanism, such as fans 71 and 73 provided for the projector.

By providing the filter box 100B with the cooling mechanism 140, it is possible to supply cooling air lower than the environmental temperature to the projector 10. Since the cooling efficiency of the component 20 provided within the enclosure 11 of the projector 10 is improved by supplying low-temperature cooling air to the projector 10, it is possible to obtain necessary cooling performance even if driving capabilities of the fans 71 and 73 of the projector 10 are degraded. By degrading the driving capabilities of the fans 71 and 73, noise suppression of the projector 10 can also be achieved. In addition, by reducing the air volume, the air volume transmitted through the box-side filter 110 of the filter box 100B and the main body filter 40 of the projector can be reduced. As a result, deposition of dust or the like on each of the filters 110 and 40 can be reduced to achieve extension of the filter life.

In addition, it may be possible to extend the lives of some devices such as liquid crystal panels among components constituting the projector 10 by being used in the state where the temperature is low. In order to lower the internal temperature of the projector 10, it is sufficient if cooling air to be taken in via the air inlet 12 has a low temperature, without reducing the driving capabilities of the fans 71 and 73 of the projector 10, for example. Therefore, as shown in FIG. 10, by attaching the filter box 100B having the cooling mechanism 140 to the projector 10, the internal temperature of the projector 10 can be lowered to extend the lives of the components.

In this manner, by providing the cooling mechanism 140 for the filter box 100B, the life of the component 20 provided within the projector 10 can be extended. In addition, since cooling air at a still lower temperature can be supplied to the projector 10 by the cooling mechanism 140, it is possible to obtain necessary cooling performance even if the driving capabilities of the fans 71 and 73 of the projector 10 are degraded, and it is also possible to achieve noise suppression.

6. Conclusion

According to the image projection unit of the present disclosure, the filter box is provided in a manner covering the air inlet of the projector main body so as to protrude at least from a surface in which the air inlet is formed. Accordingly, it is possible to ensure an opening area larger than that of the air inlet of the projector with the box air inlet of the filter box to increase the total area of the box-side filter larger than the area of the main body filter of the projector.

Accordingly, since dust is less likely to adhere to the box-side filter, and the pressure loss can also be reduced, passage of cooling air to be taken in into the projector is no longer inhibited. In addition, intrusion of dust or the like into the projector itself can be prevented, and the life of the projector can also be extended. Further, by making the filter box attachable/detachable to/from the projector, the user can select installation of the filter box. As a result, it is not necessary to provide the projector with unnecessary functions, and a cost increase that would be caused by providing the functions can also be avoided.

In addition, in the case of providing the filter box with a fan or a cooling mechanism, the cooling function of the projector can be supported. Accordingly, the cooling ability of the cooling mechanism of the projector main body can be degraded to reduce power consumption, while maintaining cooling performance equivalent to the case of not providing the filter box. In this case, noise suppression when the projector is used can also be achieved. In addition, it is also possible to carry out higher cooling performance by means of the support of the cooling mechanism of the filter box, so that it is possible to further extend the life of the projector.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Figure 11:
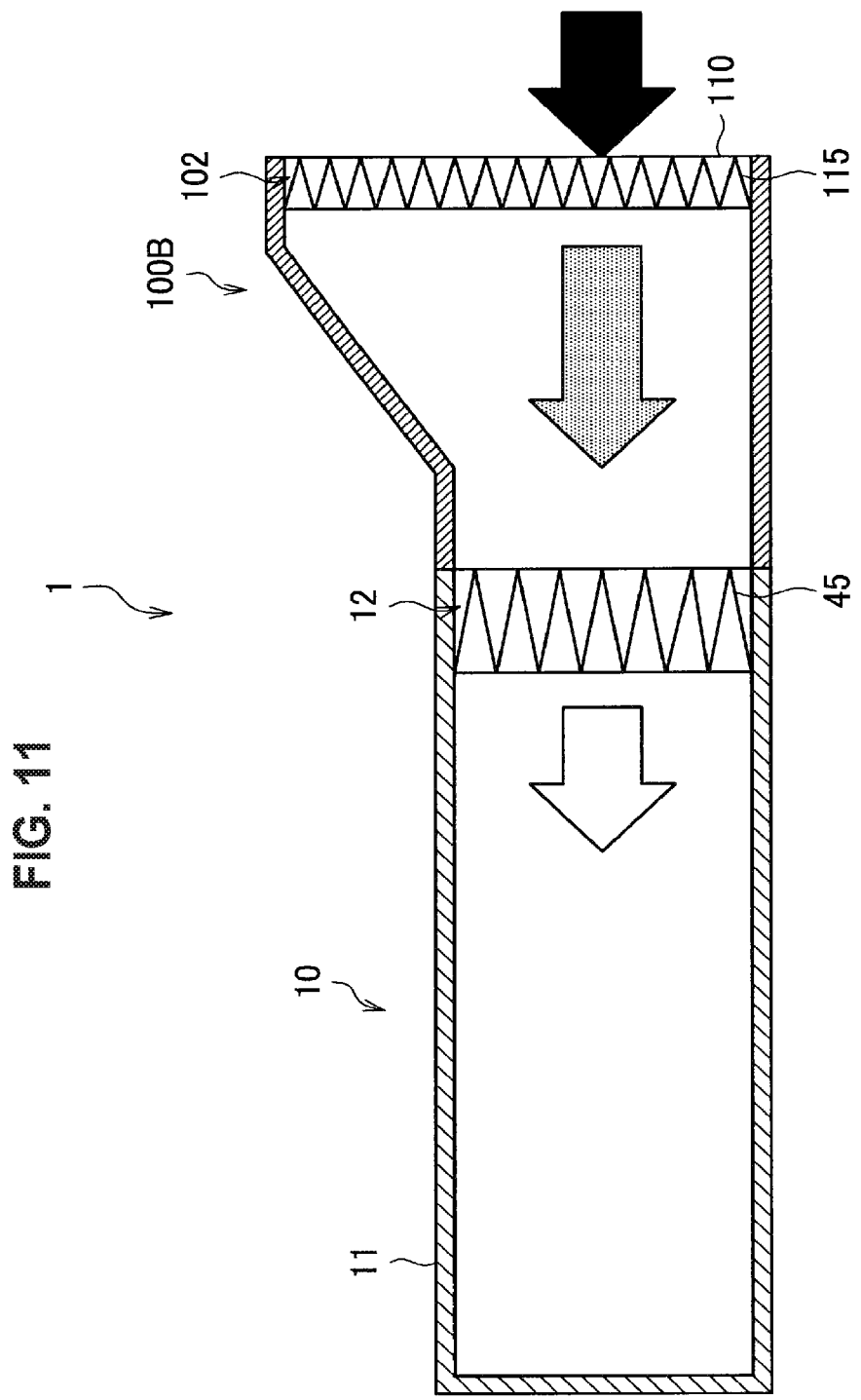
FIG. 11 is an explanatory diagram showing an exemplary configuration in the case of implementing the box-side filter and the main body filter by pleated filters.

For example, the main body filter and the box-side filter are not particularly limited in shape in the present technology, whilst pleated filters 45 and 115 having a folded structure with repeated projections and recesses may be used as shown in FIG. 11, for example. When the main body filter or the box-side filter has a pleated shape, the filter area can be made larger, and the pressure loss caused by the filter can be made smaller.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An image projection unit including:

a main body of an image projection device; and a filter box that can be attached/detached to/from the main body, and at least covers an air inlet of the main body, in which a box-side filter provided for the filter box has a total area larger than an area of a main body filter provided at the air inlet of the main body.

(2)

The image projection unit according to (1), in which the filter box has a generally cuboid shape, the filter box has an opening coupled to a first surface in which the air inlet of the main body is provided, a box air inlet that is formed in at least part of surfaces other than the surface in which the opening is provided, and causes outside air to pass through into the filter box, and the box-side filter provided in correspondence with the box air inlet, and the filter box is coupled to the main body so as to protrude from the first surface to one side.

(3)

The image projection unit according to (1), in which
the filter box has
an opening coupled to a first surface in which the air inlet of the main body is provided,
a box air inlet that is formed at least in a surface opposite to the surface in which the opening is provided, and causes outside air to pass through into the filter box, and
the box-side filter provided in correspondence with the box air inlet,
the filter box has an outer shape whose cross section is enlarged from the opening toward the box air inlet opposite to the opening, and
the filter box is coupled to the main body so as to protrude from the first surface to one side.

(4)

The image projection unit according to (1), in which
the filter box has a shape that, in the main body, covers a first surface in which the air inlet is provided and a second surface which has an area larger than an area of the first surface and is continuous to the first surface, and
the filter box has
an opening coupled to the first surface of the main body,
a box air inlet that is formed at least in a surface opposite to the second surface of the main body, and causes outside air to pass through into the filter box, and
the box-side filter provided in correspondence with the box air inlet.

(5)

The image projection unit according to any one of (1) to (4), in which
the box-side filter has a density smaller than a density of the main body filter.

(6)

The image projection unit according to any one of (1) to (5), in which
at least either the main body filter or the box-side filter is a pleated filter having a folded structure with repeated projections and recesses.

(7)

The image projection unit according to any one of (1) to (5), in which
a fan is provided within the filter box.

(8)

The image projection unit according to (7), in which
the fan of the filter box is driven in synchronization with a state of connection between the filter box and the main body.

(9)

The image projection unit according to any one of (1) to (8), in which
the filter box and the main body are configured such that power can be supplied.

(10)

The image projection unit according to any one of (1) to (9), in which
a cooling mechanism is provided within the filter box.

(11)

The image projection unit according to (10), in which
the cooling mechanism is driven in synchronization with a state of connection between the filter box and the main body, and
when the filter box and the main body are connected, the cooling mechanism of the filter box is driven, and driving of a main body cooling mechanism provided for the main body is reduced.

(12)

A filter box that can be attached/detached to/from a main body of an image projection device, including:
a filter that at least covers an air inlet of the main body, and has a total area larger than an area of a main body filter provided at the air inlet of the main body.

REFERENCE OF SIGNS LIST 1 image projection unit
10 projector
11 enclosure
12 air inlet
14 exhaust port
20 component
30 cooling fan
40 filter
40 main body filter
45, 115 pleated filter
50 projection part
71, 73 fan
100, 100A, 100B, 100C filter box
101 box enclosure
102 box air inlet
102h hole
105 opening
110 box-side filter
120 fan
130 interconnect line
140 cooling mechanism

The invention claimed is:

1. An image projection unit comprising:
a main body of an image projection device; and
a filter box that can be attached/detached to/from the main body, and at least covers an air inlet of the main body,
wherein at least one box-side filter is provided for the filter box and has a total area larger than an area of a main body filter provided at the air inlet of the main body,
wherein the filter box includes a plurality of box air inlets formed in each of a plurality of side surfaces of the filter box,
wherein each of the plurality of side surfaces includes a respective box-side filter that covers each of the plurality of box air inlets.

2. The image projection unit according to claim 1, wherein
the filter box has a generally cuboid shape,
the filter box has an opening coupled to a first surface in which the air inlet of the main body is provided,
the filter box is coupled to the main body so as to protrude from the first surface to one side, and
the plurality of filter box air inlets are formed in a plurality of side surfaces in addition to the surface in which the opening is provided, and causes outside air to pass through into the filter box.

3. The image projection unit according to claim 1, wherein each of the at least one box-side filter has a density smaller than a density of the main body filter.

4. The image projection unit according to claim 1, wherein at least either the main body filter or the at least one box-side filter is a pleated filter having a folded structure with repeated projections and recesses.

5. The image projection unit according to claim 1, wherein
a fan is provided within the filter box.

6. The image projection unit according to claim 5, wherein
the fan of the filter box is driven in synchronization with a state of connection between the filter box and the main body.

7. The image projection unit according to claim 1, wherein
the filter box and the main body are configured such that power can be supplied.

8. The image projection unit according to claim 1, wherein
a cooling mechanism is provided within the filter box.

9. The image projection unit according to claim 8, wherein
the cooling mechanism is driven in synchronization with a state of connection between the filter box and the main body, and
when the filter box and the main body are connected, the cooling mechanism of the filter box is driven, and driving of a main body cooling mechanism provided for the main body is reduced.

10. A filter box that can be attached/detached to/from a main body of an image projection device, comprising:
a plurality of side surfaces, each of the plurality of side surfaces include a plurality of air inlets; and
a filter that covers the plurality of air inlets formed in each of a respective side surface of the plurality of side surfaces,
wherein the filter has a total area larger than an area of a main body filter provided at an air inlet of the main body.

11. An image projection unit comprising:
a main body of an image projection device; and
a filter box that can be attached/detached to/from the main body, and at least covers an air inlet of the main body,
wherein at least one box-side filter is provided for the filter box and has a total area larger than an area of a main body filter provided at the air inlet of the main body,
wherein the filter box has a shape that covers a first surface of the main body in which the air inlet is provided and covers a second surface of the main body, the second surface having an area larger than an area of the first surface and the second surface being continuous to the first surface,
wherein the filter box has an opening coupled to the first surface of the main body, and
wherein a side surface of the filter box opposite to the second surface of the main body includes a plurality of air inlets that allow outside air to pass through into the filter box.

* * * * *